United States Patent
Yeh et al.

(10) Patent No.: US 11,081,034 B2
(45) Date of Patent: Aug. 3, 2021

(54) DRIVING CIRCUIT FOR GAMMA VOLTAGE GENERATOR AND GAMMA VOLTAGE GENERATOR USING THE SAME

(71) Applicant: NOVATEK Microelectronics Corp., Hsin-Chu (TW)

(72) Inventors: Yun-Hsuan Yeh, Tainan (TW); Tai-Yin Wu, Tainan (TW); Ying-Hsiang Wang, New Taipei (TW); Yao-Hung Kuo, Hsinchu (TW)

(73) Assignee: NOVATEK Microelectronics Corp., Hsin-Chu (TW)

(*) Notice: Subject to any disclaimer, the term of this patent is extended or adjusted under 35 U.S.C. 154(b) by 0 days.

(21) Appl. No.: 16/828,971

(22) Filed: Mar. 25, 2020

(65) Prior Publication Data

US 2020/0380904 A1 Dec. 3, 2020

Related U.S. Application Data (60) Provisional application No. 62/856,696, filed on Jun. 3, 2019.

(51) Int. Cl.
*G09G 5/10* (2006.01)
*G09G 3/20* (2006.01)
*H03M 1/74* (2006.01)

(52) U.S. Cl.
CPC .............. *G09G 3/20* (2013.01); *H03M 1/74* (2013.01); *G09G 2310/0291* (2013.01); *G09G 2310/0297* (2013.01); *G09G 2320/0673* (2013.01)

(58) Field of Classification Search
CPC ........... G09G 2310/027; G09G 3/3696; G09G 2310/0291; G09G 3/3685; G09G 2310/0286; G09G 3/3275; G09G 2310/0289; G09G 2310/0275; G09G 3/2011; G09G 2320/0223; G09G 2320/0276; G09G 2320/0626; G09G 2310/0251; G09G 2320/0673; G09G 2310/0297; G09G 2330/028

(Continued)

(56) References Cited

U.S. PATENT DOCUMENTS 7,504,979 B1* 3/2009 Knausz ............... H03M 1/0648
  341/141
9,275,609 B2* 3/2016 Kim ...................... G09G 5/10

(Continued)

FOREIGN PATENT DOCUMENTS

TW I517129 B 1/2016

*Primary Examiner* — Duc Q Dinh
(74) *Attorney, Agent, or Firm* — Winston Hsu (57) ABSTRACT

The present invention provides a driving circuit for a gamma voltage generator of a source driver. The gamma voltage generator includes a resistor string having a plurality of tap nodes, among which a plurality of first tap nodes are respectively connected to a plurality of first buffers. The driving circuit includes a second buffer, a digital-to-analog converter (DAC) and a control circuit. The second buffer is connected to a second tap node other than the plurality of first tap nodes among the plurality of tap nodes. The DAC is coupled to the second buffer. The control circuit, coupled to the DAC, is configured to receive a plurality of first control signals for the plurality of first buffers and calculate a second control signal for the DAC according to the plurality of first control signals.

16 Claims, 5 Drawing Sheets

(58) Field of Classification Search
USPC ............... 345/211, 212, 204, 98–100, 73–76
See application file for complete search history.

(56) References Cited

U.S. PATENT DOCUMENTS

| 9,449,552 B2* | 9/2016 | Lee ..................... G09G 3/3233 |
| 2015/0243230 A1 | 8/2015 | Kim |

* cited by examiner

DRIVING CIRCUIT FOR GAMMA VOLTAGE GENERATOR AND GAMMA VOLTAGE GENERATOR USING THE SAME

CROSS REFERENCE TO RELATED APPLICATIONS

This application claims the benefit of U.S. Provisional Application No. 62/856,696, filed on Jun. 3, 2019, the contents of which are incorporated herein by reference.

BACKGROUND OF THE INVENTION

1. Field of the Invention

The present invention relates to a driving circuit, and more particularly, to a driving circuit for a gamma voltage generator of a source driver.

2. Description of the Prior Art

A source driver is a driver circuit for controlling the operations of a display panel such as a liquid crystal display (LCD) or an organic light-emitting diode (OLED) panel. The source driver provides display data for the display panel, to control each pixel or subpixel of the display panel to show target brightness, so as to construct the entire image. The source driver may include multiple channels, each configured to provide display data for a column of subpixels in the display panel. An operational amplifier is usually disposed at the output terminal of each channel, for driving the corresponding data line on the panel to reach its target voltage.

The output voltage levels of the source driver are generated from a gamma voltage generator, where voltage division of a gamma resistor string in the gamma voltage generator may generate a wide range of gamma voltages. There are multiple output buffers coupled to tap nodes of the resistor string, for providing gamma tap voltages and driving capabilities. However, since a resistor string may be required to provide input voltages for thousands of operational amplifiers (OPs) in all output channels of the source driver (hereinafter called channel OP), the resistor string should provide charging currents or discharging currents to vary the voltage levels of the input terminals of these channel OPs when their input voltages change. If the voltage level outputted from the resistor string is close to a tap voltage (i.e., the voltage on a tap node connected to an output buffer), the current provided from the output buffer may directly charge or discharge the input terminal of the channel OP in order to achieve a fast slew rate. In contrast, if the output voltage level is farther from any tap voltage, the current provided from the output buffer has to pass through resistors on the resistor string and then performs charging or discharging on the input terminal of the channel OP. This path may generate an RC time constant, causing that the input terminal of the channel OP may respond much slowly, which affects the entire slew rate.

Thus, there is a need for providing a novel driving circuit for the gamma voltage generator, to improve the slew rate of the channel OP in the source driver.

SUMMARY OF THE INVENTION

It is therefore an objective of the present invention to provide a driving circuit for a gamma voltage generator of a source driver, in order to solve the abovementioned problems.

An embodiment of the present invention discloses a driving circuit for a gamma voltage generator of a source driver. The gamma voltage generator comprises a resistor string having a plurality of tap nodes, among which a plurality of first tap nodes are respectively connected to a plurality of first buffers. The driving circuit comprises a second buffer, a digital-to-analog converter (DAC) and a control circuit. The second buffer is connected to a second tap node other than the plurality of first tap nodes among the plurality of tap nodes. The DAC is coupled to the second buffer. The control circuit, coupled to the DAC, is configured to receive a plurality of first control signals for the plurality of first buffers and calculate a second control signal for the DAC according to the plurality of first control signals.

Another embodiment of the present invention discloses a gamma voltage generator for a source driver. The gamma voltage generator comprises a resistor string, a plurality of first buffers, a plurality of first DACs and a driving circuit. The resistor string comprises a plurality of tap nodes. The plurality of first buffers are respectively connected to a plurality of first tap nodes among the plurality of tap nodes. Each of the plurality of first DACs is coupled to one of the plurality of first buffers. The driving circuit is connected to a second tap node other than the plurality of first tap nodes among the plurality of tap nodes. The driving circuit comprises a second buffer, a second DAC and a control circuit. The second buffer is connected to the second tap node. The second DAC is coupled to the second buffer. The control circuit, coupled to the second DAC, is configured to receive a plurality of first control signals for the plurality of first buffers and calculate a second control signal for the second DAC according to the plurality of first control signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
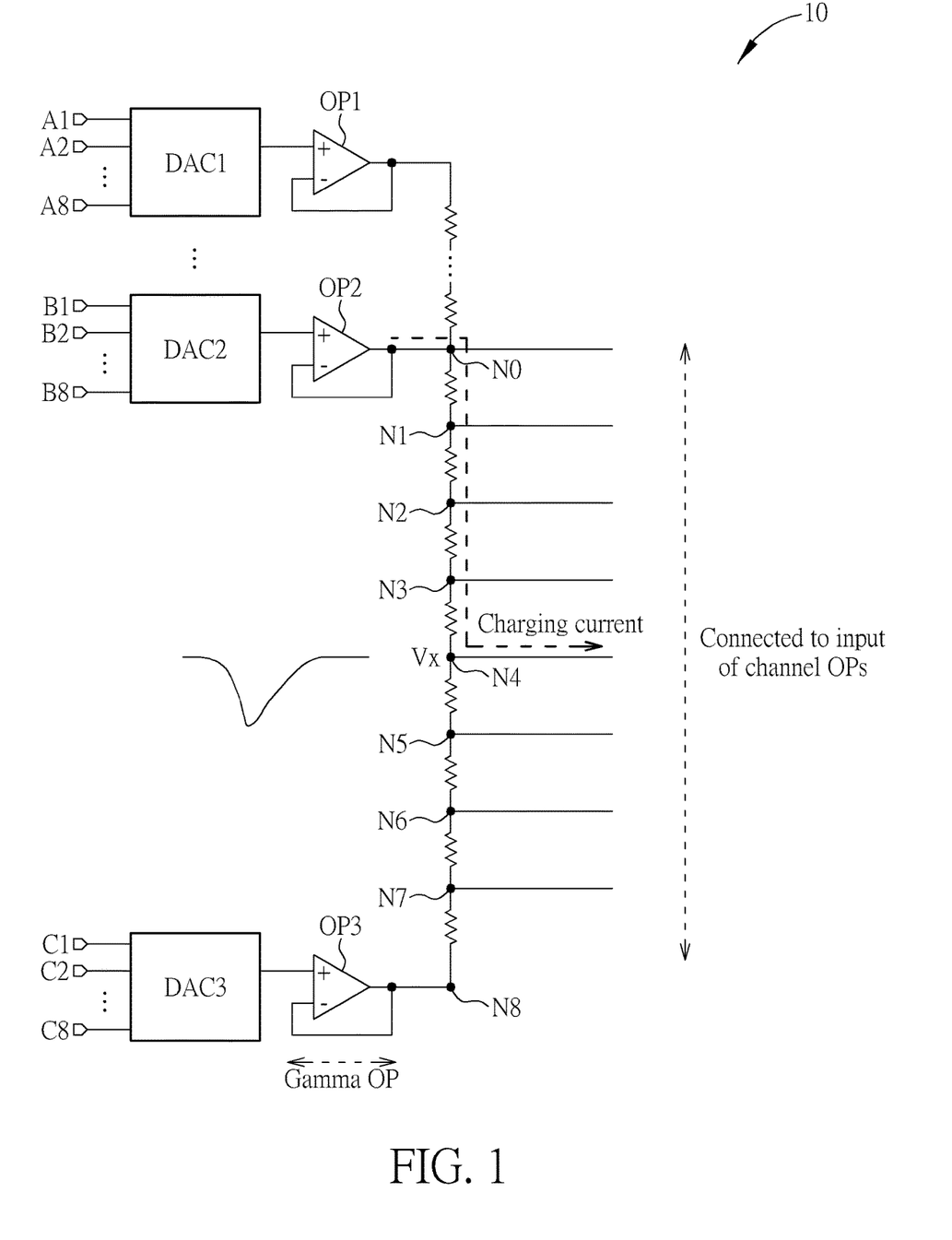
FIG. 1 is a schematic diagram of a general gamma voltage generator.

Please refer to FIG. 1, which is a schematic diagram of a general gamma voltage generator 10. As shown in FIG. 1, the gamma voltage generator 10 includes a resistor string having a plurality of resistors and a plurality of tap nodes, a plurality of buffers, and a plurality of digital-to-analog converters (DACs). The resistor string may include hundreds or thousands of resistors, for providing a wide range of voltage levels for the operational amplifiers (OPs) in the output channels of the source driver, allowing each output channel to output a dedicated voltage level corresponding to the display data. The wide range of voltage levels are generated from voltage division of the resistors in the resistor string, and each voltage level is outputted from one of the tap nodes. The DACs and the buffers are coupled to several of the tap nodes, in order to provide charging currents or discharging currents for the resistor string, allowing the source driver to output the voltage levels received from the resistor string.

For the sake of brevity, FIG. 1 only illustrates three DACs DAC1-DAC3, three OPs OP1-OP3 and their corresponding resistors in the resistor string. As shown in FIG. 1, the DACs DAC1-DAC3 are coupled to the OPs OP1-OP3, respectively, and each OP OP1-OP3 is connected as a buffer for outputting a tap voltage to the resistor string, where the output terminal of each OP OP1-OP3 is connected to its negative input terminal. The tap voltage is received from the corresponding DAC DAC1-DAC3 based on the control signals received by the DAC DAC1-DAC3. In detail, as an 8-bit DAC, the DAC DAC1 may receive an 8-bit code A1-A8 as the control signal and correspondingly output a voltage level to the OP OP1, the DAC DAC2 may receive an 8-bit code B1-B8 as the control signal and correspondingly output a voltage level to the OP OP2, and the DAC DAC3 may receive an 8-bit code C1-C8 as the control signal and correspondingly output a voltage level to the OP OP3. The DACs DAC1-DAC3 are capable of converting the 8-bit digital codes A1-A8, B1-B8 and C1-C8 into the analog voltages, respectively.

In an embodiment, the values of the codes A1-A8, B1-B8 and C1-C8 may be predetermined, and these codes together with the resistance values of the resistor string are applied to determine the voltage on each tap node, so as to generate target brightness on the panel based on the gray level data. In an embodiment, the values of the codes A1-A8, B1-B8 and C1-C8 may be adjustable based on the gamma characteristics of the panel, and thus the target brightness on the panel may be generated correspondingly.

The OPs OP1-OP3 are connected as buffers and configured to output gamma voltages to the resistor string, and thus will be called gamma OPs hereinafter. The OPs in the output channels of the source driver are configured to receive the gamma voltage from the gamma voltage generator 10 and thereby drive the data lines of a panel to reach their target voltages, and thus are called channel OPs hereinafter. Based on the gray level data of each channel, the input terminal of the channel OP may be connected to a selected tap node on the resistor string to receive the target gamma voltage from the gamma voltage generator 10.

As shown in FIG. 1, there are 8 resistors R1-R8 between the tap nodes N0 and N8 to which the gamma OPs OP2 and OP3 are connected, respectively. If a channel OP is required to receive a gamma voltage between the voltage values of the tap nodes N0 and N8, the input terminal of this channel OP may be coupled to one of the tap nodes N0-N8, and the charging/discharging current supplied to drive this channel OP may be mainly generated from the gamma OPs OP2 and/or OP3. Among the tap nodes N0-N8, the driving capability may be stronger in the tap nodes N0 and N8 since these tap nodes N0 and N8 directly receive the tap voltages from the gamma OPs OP2 and OP3, respectively. However, the driving capability may be weaker in the tap node N4 since this tap node N4 is relatively far from the tap nodes N0 and N8 where the tap voltages are received and there may be relatively larger resistance on the path between the tap node N4 and each of the tap nodes N0 and N8.

If an image frame of pure color having the same gray level data is displayed, there may be a great number of channel OPs connected to the same tap node on the resistor string. For example, when the input terminals of a great number of channel OPs, which are originally in a lower voltage level, are configured to receive a gamma voltage Vx on the tap node N4, these input terminals may be simultaneously switched to be connected to the tap node N4. The simultaneous connection may cause a larger voltage drop appearing on the tap node N4. Although the gamma OP OP2 may perform charging to recover its voltage level, the weaker driving capability on the tap node N4 may cause the recovery speed of the gamma voltage Vx to be too slow, which affects the slew rate of the channel OPs and thereby degrades the display quality.

Figure 2:
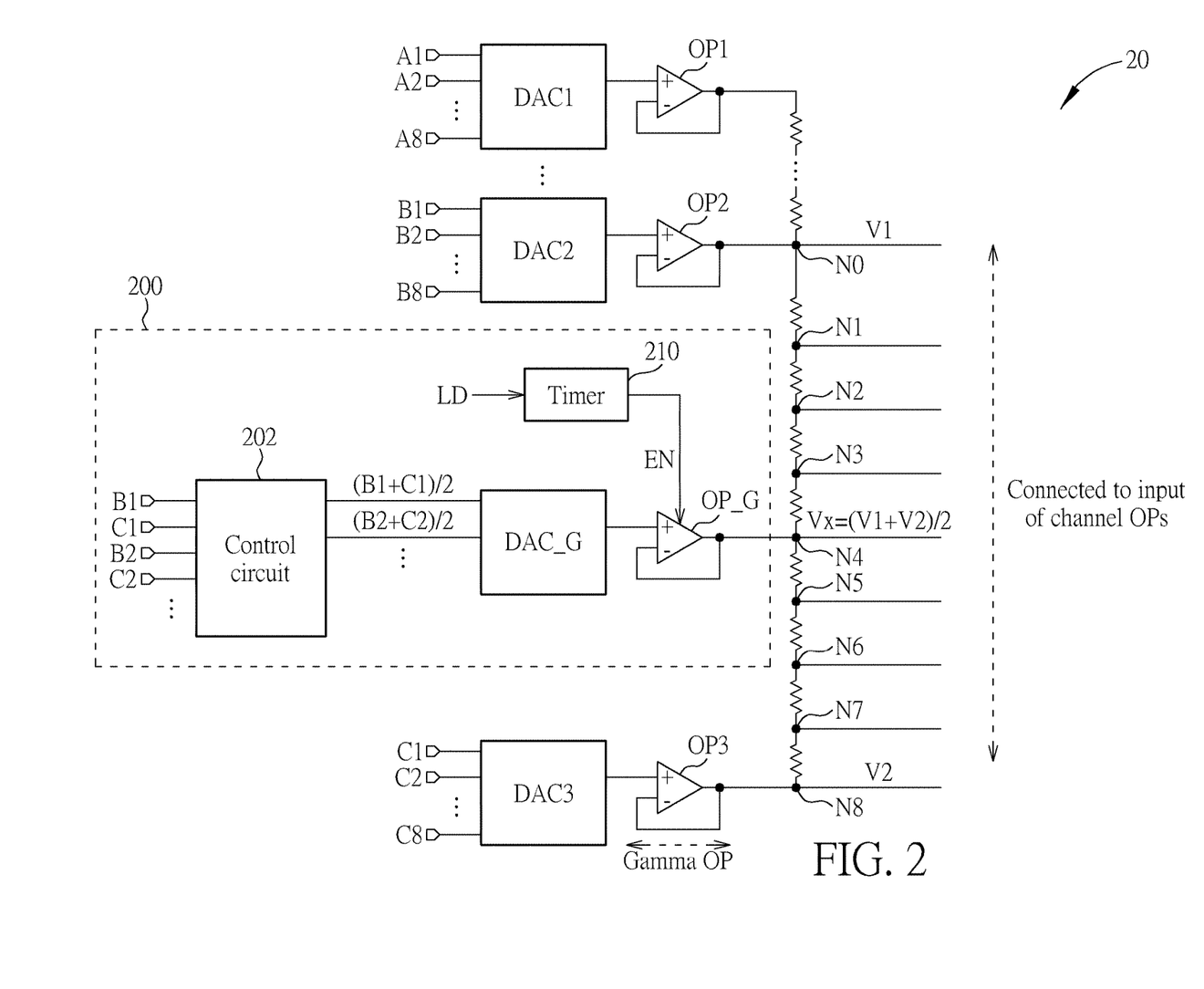
FIG. 2 is a schematic diagram of a gamma voltage generator according to an embodiment of the present invention.

Please refer to FIG. 2, which is a schematic diagram of a gamma voltage generator 20 according to an embodiment of the present invention. As shown in FIG. 2, the circuit structure of the gamma voltage generator 20 is similar to the circuit structure of the gamma voltage generator 10, so signals and elements having similar functions are denoted by the same symbols. The gamma voltage generator 20 is different from the gamma voltage generator 10 in that, the gamma voltage generator 20 further includes a gamma driving circuit 200. The gamma driving circuit 200 includes an OP OP_G, a DAC DAC_G and a control circuit 202. The OP OP_G is connected to the tap node N4, which may be a tap node relatively far from the tap node connected to other gamma OPs (e.g., N0 or N8). The OP OP_G may be connected as a buffer, as similar to other gamma OPs in the gamma voltage generator 20, for outputting a tap voltage to the resistor string. The DAC DAC_G is coupled to the OP OP_G. The tap voltage of the OP OP_G is received from the DAC DAC_G based on the control signal received by the DAC DAC_G. This control signal may be calculated and determined by the control circuit 202. The DAC DAC_G and the OP OP_G may provide additional driving capability for supplying charging/discharging currents through a tap node relatively far from the tap nodes connected to original gamma OPs; hence, the recovery speed of the voltages on this tap node and other nearby tap nodes may be improved. As a result, the slew rate of the channel OPs connected to this tap node and nearby tap nodes may be improved accordingly, which thereby improves the display quality.

In detail, the gamma driving circuit 200 is connected to the tap node N4, which is a tap node relatively far from the tap nodes N0 and N8 among the tap nodes N1-N7, i.e., the middle node between the tap nodes N0 and N8, and thus the tap node N4 may originally have weaker driving capability than other tap nodes between N0 and N8. Therefore, the gamma driving circuit 200 applied to the tap node N4 may provide better improvement of the driving capability.

The control circuit 202 may be a mathematical operation unit, for calculating the digital codes corresponding to the gamma voltage Vx on the tap node N4. The value of the gamma voltage Vx may correspond to the control signal received by the DAC DAC_G, and this control signal may be determined according to the control signals for other gamma OPs in the gamma voltage generator 20. Since the tap node N4 is the middle node between the tap nodes N0 and N8, the gamma voltage Vx may be determined according to the gamma voltages V1 and V2 on the tap nodes N0 and N8. This may be achieved by performing mathematical operations on the corresponding control signals. For example, the control circuit 202 may receive the codes B1-B8 for the OP OP2 and the codes C1-C8 for the OP OP3, and calculate the control signal to be sent to the DAC DAC_G and the OP OP_G according to the codes B1-B8 and C1-C8.

In this embodiment, the resistance value of the resistors between the tap node N4 and the tap node N0 may be substantially equal to the resistance value of the resistors between the tap node N4 and the tap node N8, and thus it is much easier to calculate the gamma voltage Vx on the tap node N4 based on the gamma voltages V1 and V2. More specifically, the control circuit 202 may determine the voltage Vx to be equal to the average of the voltages V1 and V2 of the nodes N0 and N8. To achieve this purpose, the input codes D1-D8 of the DAC DAC_G may be obtained as:

$$D1=(B1+C1)/2;$$

$$D2=(B2+C2)/2; \ldots$$

$$D8=(B8+C8)/2.$$

Therefore, even if the values of the codes B1-B8 and C1-C8 may be adjusted to be adapted to the panel characteristics or for other reasons, the obtained input codes D1-D8 of the DAC DAC_G may be adjusted correspondingly. As a result, the voltage value outputted by gamma driving circuit 200 may still be accurate based on the original tap voltages on the resistor string.

However, in this embodiment, the DACs DAC2, DAC3 and DAC_G are 8-bit DAC, and thus the calculation results of the control signals (i.e., the codes D1-D8) for the DAC DAC_G may possess a round-off error. This error may generate a slight deviation on the level of the voltage Vx. In order to solve this problem, an enable signal EN may be applied to the gamma driving circuit 200, to enable the gamma driving circuit 200 only when the additional driving capability is necessary. After the voltages of the resistor string become stable, the gamma driving circuit 200 may be turned off and the round-off error of the gamma driving circuit 200 may not interfere with the gamma voltage values. In addition, power consumption may be reduced if the circuit elements in the gamma driving circuit 200 are turned off during the voltage stable time.

In an embodiment, the problem of round-off error may also be solved by applying a more powerful DAC (e.g., a 9-bit DAC) in the gamma driving circuit. However, this type of DAC may require more power consumption and occupy larger circuit area.

As shown in FIG. 2, the OP OP_G may be controlled by the enable signal EN, to be enabled at the time where the voltage on its connected tap node (i.e., the tap node N4) may drop to a lower level. When the voltage on this tap node recovers to a predetermined voltage value (e.g., near the normal voltage of this tap node), the OP OP_G may be disabled. The gamma driving circuit 200 may further include a timer 210 coupled to the OP OP_G, where timer 210 is configured to determine when to enable the OP OP_G and when to disable the OP OP_G. The timer 210 may receive an LD signal of the source driver and correspondingly generate the enable signal EN to be sent to the OP OP_G, so as to enable the OP OP_G for a predetermined period of time. Alternatively, the timer may be a module independent of the gamma driving circuit 200, and/or another enable signal may be sent to the control circuit 202 or the DAC DAC_G for enabling/disabling its operation. The detailed implementations of the enablement may not be a limitation to the scope of the present invention.

Figure 3:
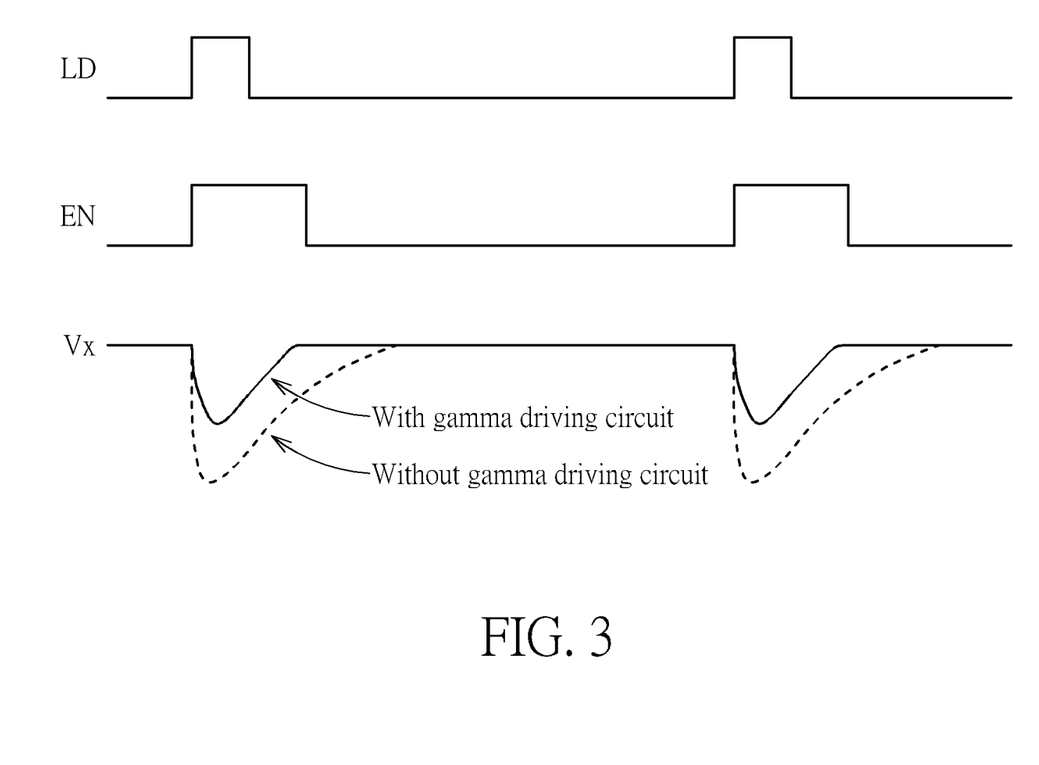
FIG. 3 is a timing diagram of control of the gamma driving circuit.

Please refer to FIG. 3, which is a timing diagram of control of the gamma driving circuit 200. FIG. 3 illustrates the waveforms of the LD signal, the enable signal EN and the voltage Vx on the tap node N4. As shown in FIG. 3, without the gamma driving circuit 200, the voltage Vx may fall to a lower level and then recover to its original level more slowly. In comparison, with the gamma driving circuit 200, the falling degree of the voltage Vx is less than the falling degree under the situation where the gamma driving circuit 200 is absent, and the recovery speed of the voltage Vx is faster than the recovery speed under the situation where the gamma driving circuit 200 is absent.

As shown in FIG. 3, the enable signal EN is synchronized with the LD signal. In general, the LD signal may be configured to instruct the source driver to load a row of newly arrived display data to the channel OPs, allowing the source driver to update the output voltage in each channel. At this moment, the input terminal of the channel OPs is switched to be connected to a tap node for receiving a specific voltage corresponding to the new display data, causing the voltage on the tap node(s) (especially those connected to a great number of channel OPs) to fall. Therefore, the enable signal EN may control the gamma driving circuit 200 to be enabled, in order to provide additional driving capability to drive the voltage level on the tap node to recover more rapidly (as the start of pulse of the enable signal EN). With the implementation of the timer 210, the pulse of the enable signal EN may end after a time period predetermined in the timer 210. For example, the timer 210 may monitor the LD signal and determine the falling edge of the LD signal, and the enable signal EN may be pulled low after the LD signal is pulled low by a delay time. The length of the enable pulse may be configured arbitrarily, as long as the pulse length is long enough to control the tap voltage to recover to its normal level.

Please note that the embodiments of the present invention aim at providing a gamma driving circuit for a gamma voltage generator of a source driver in order to provide additional driving capability for the tap nodes of the resistor string in the gamma voltage generator. Those skilled in the art may make modifications and alternations accordingly. For example, in the above embodiment, the gamma driving circuit 200 is connected to the tap node N4, which is the middle node of the tap nodes N0 and N8 connected to original gamma OPs. In another embodiment, a gamma driving circuit may be connected to any of the tap nodes N1, N2, N3, N5, N6 or N7 according to system requirements. In addition, in the above embodiment, there is a gamma driving circuit 200 disposed between two groups of DACs and OPs. In another embodiment, one or more gamma driving circuits may be applied to be connected to multiple tap nodes between two groups of DACs and OPs, in order to further improve the recovery speed of the gamma voltage and thereby improve the slew rate of the channel OPs in the source driver.

Figure 4:
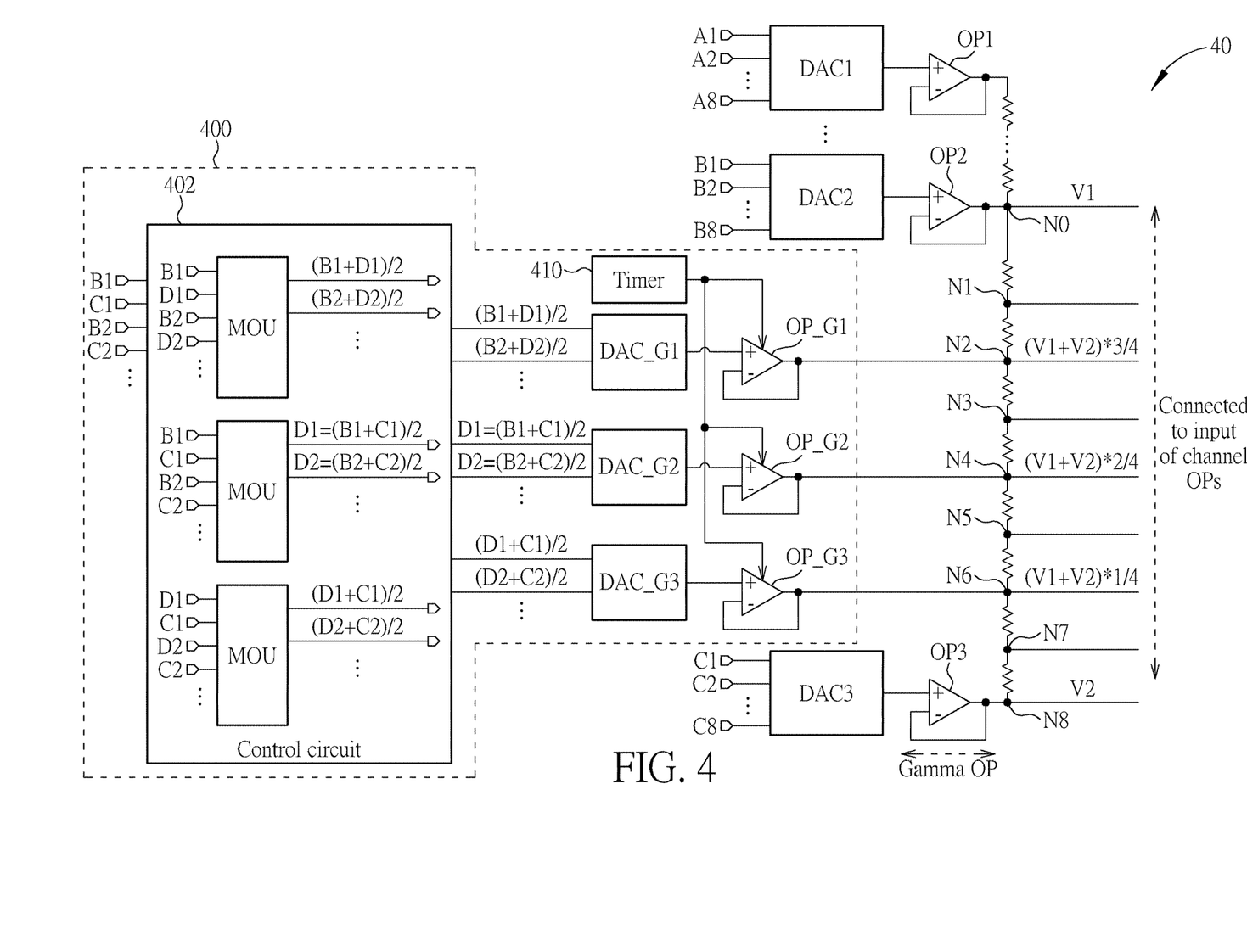
FIG. 4 is a schematic diagram of another gamma voltage generator according to an embodiment of the present invention.

For example, please refer to FIG. 4, which is a schematic diagram of another gamma voltage generator 40 according to an embodiment of the present invention. As shown in FIG. 4, the circuit structure of the gamma voltage generator 40 is similar to the circuit structure of the gamma voltage generator 20, so signals and elements having similar functions are denoted by the same symbols. The gamma voltage generator 40 is different from the gamma voltage generator 20 in that, the gamma voltage generator 40 includes a gamma driving circuit 400 to replace the gamma driving circuit 200 of the gamma voltage generator 20. The gamma driving circuit 400 includes three OPs OP_G1-OP_G3, three DACs DAC_G1-DAC_G3, a control circuit 402 and a timer 410.

In the gamma driving circuit 400, the OPs OP_G1-OP_G3 are connected to the tap nodes N2, N4 and N6, respectively. Similarly, each of the OPs OP_G1-OP_G3 are connected as a buffer, as similar to other gamma OPs in the gamma voltage generator 40, for outputting a tap voltage to the resistor string. The DACs DAC_G1-DAC_G3 are coupled to the OPs OP_G1-OP_G3, respectively. The tap voltages of the OPs OP_G1-OP_G3 are respectively received from the corresponding DACs DAC_G1-DAC_G3 based on the control signals received by the DACs DAC_G1-DAC_G3. The control signals may be calculated and determined by the control circuit 402. The gamma driving circuit 400 provides additional driving capability for supplying charging/discharging currents through multiple tap nodes N2, N4 and N6, in order to further increasing the recovery speed of the voltages on the tap nodes.

Similarly, the control circuit 402 may include multiple mathematical operation units (MOUs), for calculating the digital codes corresponding to the gamma voltages on the tap nodes N2, N4 and N6. The values of the gamma voltages may correspond to the control signal received by the DACs DAC_G1-DAC_G3, respectively, and these control signals may be determined according to the control signals for other gamma OPs in the gamma voltage generator 40. More specifically, the gamma voltages on the tap nodes N2, N4 and N6 may be determined to be equal to (V1+V2)×¾, (V1+V2)×²⁄₄, and (V1+V2)×¼, respectively, based on the gamma voltages V1 and V2 on the tap nodes N0 and N8, and the related input codes for the DACs DAC_G1-DAC_G3 may be determined as those shown in Table 1. In this embodiment, the gamma driving circuit 400 provides the tap voltages for multiple tap nodes N2, N4 and N6.

TABLE 1

| Tap node | DAC input code | DAC output voltage |
|---|---|---|
| N0 | $\sum_{i=1}^{n} B_i$ | V1 |
| N2 | $\sum_{i=1}^{n} \frac{(B_i + D_i)}{2}$ | $(V1 + V2) \times \frac{3}{4}$ |
| N4 | $D_i = \sum_{i=1}^{n} \frac{(B_i + C_i)}{2}$ | $(V1 + V2) \times \frac{2}{4}$ |
| N6 | $\sum_{i=1}^{n} \frac{(D_i + C_i)}{2}$ | $(V1 + V2) \times \frac{1}{4}$ |
| N8 | $\sum_{i=1}^{n} C_i$ | V2 |

In the gamma driving circuit 400, the timer 410 is configured to determine when to enable the OPs OP_G1-OP_G3 and when to disable the OPs OP_G1-OP_G3. The detailed operations of the timer 410 are similar to those of the timer 210 shown in FIG. 2, and are illustrated in the above paragraphs and will be omitted herein.

In order to provide an even higher slew rate for the source driver, a gamma driving circuit may output the tap voltages as more as possible, or more similar gamma driving circuits may be applied under the limitations of power consumption and circuit area. Alternatively, an output terminal of the gamma driving circuit may be dynamically connected to different tap nodes, in order to provide the tap voltages and driving capability flexibly.

Figure 5:
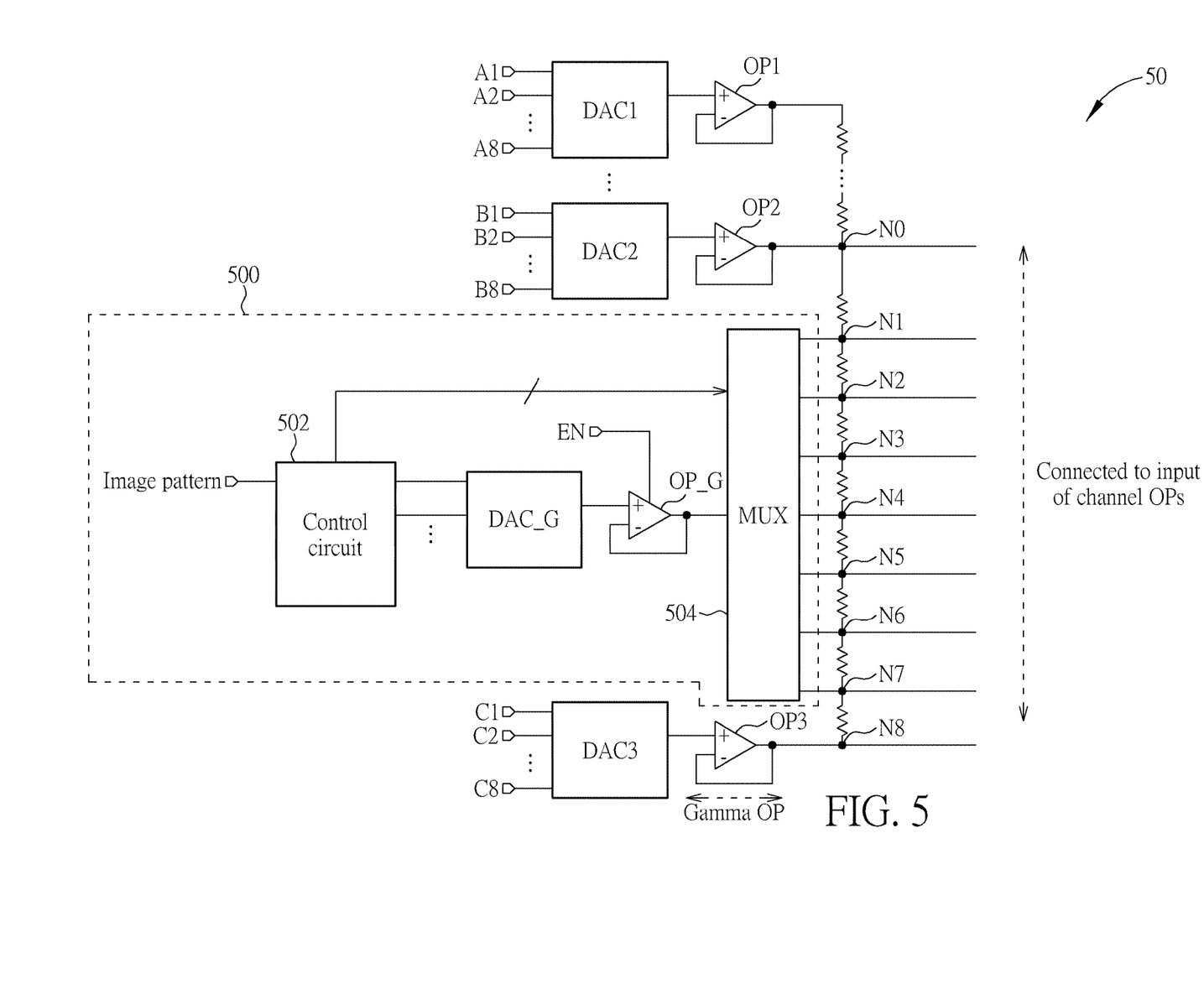
FIG. 5 is a schematic diagram of a further gamma voltage generator according to an embodiment of the present invention.

Please refer to FIG. 5, which is a schematic diagram of a further gamma voltage generator 50 according to an embodiment of the present invention. As shown in FIG. 5, the circuit structure of the gamma voltage generator 50 is similar to the circuit structure of the gamma voltage generator 20, so signals and elements having similar functions are denoted by the same symbols. The gamma voltage generator 50 is different from the gamma voltage generator 20 in that, the gamma voltage generator 50 includes a gamma driving circuit 500 to replace the gamma driving circuit 200 of the gamma voltage generator 20. In addition to generating the input codes for the DAC DAC_G, the control circuit 502 of the gamma driving circuit 500 is further configured to perform pattern detection to determine an image pattern of the display data to be received by the source driver, and a multiplexer (MUX) 504 is coupled between the OP OP_G of the gamma driving circuit 500 and the resistor string, in order to selectively connect the OP OP_G to one of multiple tap nodes on the resistor string.

As shown in FIG. 5, the gamma driving circuit 500 may selectively output a tap voltage to any of the tap nodes N1-N7, based on the status of the MUX 504, which may be controlled by the control circuit 502. In detail, the control circuit 502 may receive information of an image pattern of the display data; hence, before an image frame is displayed, the control circuit 502 may predict that a majority of the channel OPs in the source driver may receive the gamma voltages from a specific node on the resistor string of the gamma voltage generator 50 according to the image pattern, and thereby connect the OP OP_G to the specific node when the display data of this image frame is outputted by the source driver. Correspondingly, the control circuit 502 may calculate a digital code corresponding to the voltage on this tap node and output the digital code to the DAC DAC_G. In an embodiment, since image data may be outputted from the source driver to the panel row by row, the connection of MUX 504 may be determined based on each row of image data. Therefore, the control circuit 502 may control the OP OP_G to be connected to a specific node when a row of image data is outputted from the source driver if this row of display data appears to let the channel OPs to receive a gamma voltage from the specific node.

In this embodiment, the gamma driving circuit 500 may be connected to any of the tap nodes N1-N7 between the tap nodes N0 and N8 connected to an original gamma OP for receiving a tap voltage. In another embodiment, the gamma driving circuit 500 may also be applied to any other tap nodes beyond the tap node N0 or N8. Alternatively, there may be multiple gamma driving circuits similar to the gamma driving circuit 500 implemented in the gamma voltage generator 50, in order to dynamically provide driving capability for multiple nodes on the resistor string in each output cycle of the display data.

As a result, with the dynamic control of the gamma driving circuit 500 based on pattern detection, one DAC and one OP may be applied to improve the recovery time for multiple tap nodes on the resistor string. Therefore, the gamma driving circuit 500 with dynamic output control may significantly reduce the number of OPs, to reduce the circuit area while achieving fast recovery speed in the gamma voltage generator 50.

To sum up, the embodiments of the present invention may provide a gamma driving circuit for a gamma voltage generator of a source driver. The gamma driving circuit may provide an additional OP to be connected to the resistor string of the gamma voltage generator, to provide additional driving capability for the resistor string, allowing the tap voltages on the resistor string to recover more rapidly when the channel OPs of the source driver update their output voltages and receive the gamma voltages from the gamma voltage generator. In an embodiment, the gamma driving circuit and the OP therein may be enabled when the voltage on the connected tap node is drawn by the input terminal of channel OPs and thus drops to a lower level, and then be disabled after a predetermined time period based on control of a timer. In an embodiment, the gamma driving circuit may include multiple OPs respectively connected to multiple tap nodes on the resistor string, in order to further improve the recovery speed of the gamma voltages. In an embodiment, an output terminal of the gamma driving circuit may be dynamically connected to different tap nodes, i.e., a gamma OP of the gamma driving circuit may be selectively connected to one of multiple tap nodes in each output cycle of the display data, based on the image pattern detected by the control circuit in the gamma driving circuit. As a result, with the gamma driving circuit of the present invention, the recovery speed of the voltage(s) on the tap node(s) may be improved, and the slew rate of the channel OPs of the source driver may be improved accordingly, so as to generate higher display quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving circuit for a gamma voltage generator of a source driver, the gamma voltage generator comprising a resistor string having a plurality of tap nodes, among which a plurality of first tap nodes are respectively connected to a plurality of first buffers, the driving circuit comprising:
   a second buffer, connected to a second tap node other than the plurality of first tap nodes among the plurality of tap nodes;
   a digital-to-analog converter (DAC), coupled to the second buffer; and
   a control circuit, coupled to the DAC, configured to receive a plurality of first control signals for the plurality of first buffers and calculate a second control signal to be sent to the DAC according to the plurality of first control signals;
   wherein the second tap node is located between two of the plurality of first tap nodes, and resistance values of resistors between the second tap node and the two first tap nodes are substantially equal; and
   wherein the second tap node is driven by the second buffer with an average voltage of two voltages of the two first tap nodes.

2. The driving circuit of claim 1, wherein the control circuit is configured to calculate the second control signal to be sent to the DAC according to the plurality of first control signals for two of the plurality of first buffers configured to drive the two first tap nodes.

3. The driving circuit of claim 1, further comprising:
   a timer, coupled to the second buffer, configured to enable the second buffer for a predetermined time period.

4. The driving circuit of claim 3, wherein the second buffer is enabled when an output voltage of the source driver is updated.

5. The driving circuit of claim 3, wherein the second buffer is disabled after a voltage of the second tap node recovers to a predetermined voltage value.

6. The driving circuit of claim 1, further comprising:
   a multiplexer, coupled between the second buffer and the resistor string, configured to selectively connect the second buffer to one of a plurality of second tap nodes on the resistor string.

7. The driving circuit of claim 6, wherein the control circuit is further configured to receive information of display data to be received by the source driver and control the multiplexer to perform the selection accordingly.

8. The driving circuit of claim 7, wherein the multiplexer is configured to selectively connect the second buffer to the one of the plurality of second tap nodes when a majority of a plurality of channel operational amplifiers in the source driver receive a voltage from the second tap node according to the information of the display data.

9. A gamma voltage generator for a source driver, comprising:
   a resistor string, comprising a plurality of tap nodes;
   a plurality of first buffers, respectively connected to a plurality of first tap nodes among the plurality of tap nodes;
   a plurality of first digital-to-analog converters (DACs), each coupled to one of the plurality of first buffers; and
   a driving circuit, connected to a second tap node other than the plurality of first tap nodes among the plurality of tap nodes, the driving circuit comprising:
      a second buffer, connected to the second tap node;
      a second DAC, coupled to the second buffer; and
      a control circuit, coupled to the second DAC, configured to receive a plurality of first control signals for the plurality of first buffers and calculate a second control signal to be sent to the second DAC according to the plurality of first control signals;
   wherein the second tap node is located between two of the plurality of first tap nodes, and resistance values of resistors between the second tap node and the two first tap nodes are substantially equal; and
   wherein the second tap node is driven by the second buffer with an average voltage of two voltages of the two first tap nodes.

10. The gamma voltage generator of claim 9, wherein the control circuit is configured to calculate the second control signal to be sent to the second DAC according to the plurality of first control signals for two of the plurality of first buffers configured to drive the two first tap nodes.

11. The gamma voltage generator of claim 9, wherein the driving circuit further comprises:
   a timer, coupled to the second buffer, configured to enable the second buffer for a predetermined time period.

12. The gamma voltage generator of claim 11, wherein the second buffer is enabled when an output voltage of the source driver is updated.

13. The gamma voltage generator of claim 11, wherein the second buffer is disabled after a voltage of the second tap node recovers to a predetermined voltage value.

14. The gamma voltage generator of claim 9, wherein the driving circuit further comprises:
   a multiplexer, coupled between the second buffer and the resistor string, configured to selectively connect the second buffer to one of a plurality of second tap nodes on the resistor string.

15. The gamma voltage generator of claim 14, wherein the control circuit is further configured to receive information of display data to be received by the source driver and control the multiplexer to perform the selection accordingly.

16. The gamma voltage generator of claim 15, wherein the multiplexer is configured to selectively connect the second buffer to the one of the plurality of second tap nodes when a majority of a plurality of channel operational amplifiers in the source driver receive a voltage from the second tap node according to the information of the display data.

* * * * *